:::{.patent-header}
United States Patent [19]

Hashimoto et al.

[11] Patent Number: 5,455,438

[45] Date of Patent: Oct. 3, 1995
:::

[54] SEMICONDUCTOR INTEGRATED CIRCUIT DEVICE IN WHICH KINK CURRENT DISTURBANCES OF MOS TRANSISTORS ARE SUPPRESSED

[75] Inventors: Naotaka Hashimoto, Kokubunji; Toshiaki Yamanaka, Iruma; Takashi Hashimoto, Hachioji; Akihiro Shimizu; Nagatoshi Ohki, both of Akishima; Hiroshi Ishida, Fussa, all of Japan

[73] Assignees: Hitachi, Ltd.; Hitachi VLSI Engineering Corp., both of Tokyo, Japan

[21] Appl. No.: 69,572

[22] Filed: Jun. 1, 1993

Related U.S. Application Data

[63] Continuation of PCT/JP92/01209, Sep. 22, 1992.

[30] Foreign Application Priority Data

Oct. 1, 1991 [JP] Japan .................. 3-253472

[51] Int. Cl.⁶ .............. H01L 27/088; H01L 27/105; H01L 21/762
[52] U.S. Cl. .............. 257/391; 257/393; 257/506; 257/510; 257/903
[58] Field of Search .............. 257/203, 210, 257/211, 506, 509, 903, 904, 369, 371, 374, 390–393, 510

[56] References Cited

U.S. PATENT DOCUMENTS

| 5,057,449 | 10/1991 | Lowrey et al. | 437/60 |
| 5,196,910 | 3/1993 | Moriuchi et al. | 257/510 |

FOREIGN PATENT DOCUMENTS

| 0011343 | 1/1989 | Japan . | |
| 0237158 | 9/1990 | Japan . | |
| 0303049 | 12/1990 | Japan | 257/506 |
| 0046345 | 2/1991 | Japan | 257/506 |
| 0187224 | 8/1991 | Japan . | |

OTHER PUBLICATIONS

Patent Abstracts of Japan, Kokai #63–079371, vol. 012314, Abs. Published Aug. 25, 1988.

Patent Abstracts of Japan, Kokai #63–140567, vol. 012397, Abs. Published Oct. 21, 1988.

Patent Abstracts of Japan, Kokai #03–187224, vol. 015442, Abs. Published Nov. 11, 1991.

*Primary Examiner*—William Mintel
*Assistant Examiner*—Peter Toby Brown
*Attorney, Agent, or Firm*—Antonelli, Terry, Stout & Kraus

[57] ABSTRACT

Disclosed is a semiconductor integrated circuit device having a plurality of fine memory devices and its fabrication method, and particularly to a semiconductor integrated circuit device capable of suppressing the kink current disturbance of MOS transistors without reducing the junction characteristic of the diffusion layers and its fabrication method. In this device, an angle between the lower surface of each edge of a field oxide formed in an environmental device area, i.e. a peripheral circuit area, and the main surface of a semiconductor substrate is smaller than an angle between the lower surface of each edge of a field oxide formed in a memory cell area and the main surface of the semiconductor substrate. Further, the extension, in the direction of being parallel to the main surface of the semiconductor substrate, of each edge of the field oxide in the environmental device area is larger than the extension, in the direction of being parallel to the main surface of the semiconductor substrate, of each edge of the field oxide in the memory cell area.

7 Claims, 12 Drawing Sheets

SEMICONDUCTOR INTEGRATED CIRCUIT DEVICE IN WHICH KINK CURRENT DISTURBANCES OF MOS TRANSISTORS ARE SUPPRESSED

This application is a continuation of International application No. PCT/JP92/01209, filed Sep. 22, 1992 and designating the United States of America.

TECHNICAL FIELD

The present invention relates to a semiconductor integrated circuit device having fine semiconductor devices and a method of fabricating the same, and, particularly, to a semiconductor integrated circuit device capable of effectively suppressing the kink (disturbance) current of MOS transistors and a method of fabricating the same.

BACKGROUND ART

In a conventional semiconductor integrated circuit device, silicon dioxide films for isolation (field isolation insulating films) are formed both on a memory cell area having a plurality of memory devices (elements) and on an environmental device area (e.g., peripheral area) having a plurality of devices (elements) using the same local oxidation technique. Consequently, for realizing an extremely fine memory cell area, i.e. a finely defined small-sized memory cell area, how the major obstacle that must be considered is lateral extension (bird-beak) of the silicon dioxide film, generated by the local oxidation, can be made smaller.

However, as a result of increasing the impurity concentration of the semiconductor substrate to make smaller the bird beaks and to make further fine the devices, the kink has developed in the subthreshold characteristic of the MOS transistors due to the leakage current flowing through channels which are parasitically formed at the boundary between the active region and the field isolation area. This exhibits such an apparent characteristic that the MOS transistors having low threshold voltages are connected in parallel to each other. The phenomenon of the kink is observed even in the device having the wide channel, whereas in the device having the narrow channel width, it appears in the form of a lowering of the threshold voltage.

In order to suppress the generation of the kink, there has been proposed a technique, for example, in Japanese Laid-open No. hei 2-237158, wherein the generation of the kink current (the current which is allowed to flow by the above-mentioned kink phenomenon) is suppressed by locally increasing the impurity concentration at each end of the device through which the kink current flows.

This technique will be described with reference to FIG. 10. Here, a trench type isolation is used, that is, a field oxide 2 is buried in a trench formed in a field isolation area. Also, a thick polycrystalline silicon film 19, which serves as a mask in boron (B)-ion implantation, is formed on an active area through a thin oxide film 3. Boron-ions are implanted by a specified depth perpendicularly to a semiconductor substrate 1. At this time, by the effect of lateral scatter, p-type layers 15 having a higher concentration than the semiconductor substrate 1 are formed on the ends of each device. Also, a p-type channel stopper layer 20 for isolation is formed under the field oxide 2.

Other measures for overcoming the kink have been proposed, for example, in Japanese Laid-open hei 2-303049, wherein the side walls of the field isolation trench formed on the edges of the active area where the gate electrodes are crossed to each other are inclined. This technique will be described with reference to FIG. 11. Here, in forming the field isolation trench on the surface of the semiconductor substrate by dry etching, energy beams for excitation are scanned in a specified direction, so that side surfaces 23, in the above specified direction, of the field isolation trench are made to be perpendicular to the surface 21 of the semiconductor substrate, and the other side surfaces 22 of the field isolation trench are inclined. By formation of a gate electrode 18 so as to be crossed to the inclined surfaces, the generation of the kink is suppressed. In this figure, numeral 24 indicates the bottom surface of the field isolation trench. An insulator is buried within the field isolation trench.

Meanwhile, in the device which has the field isolation insulating film of the short bird beaks and is narrow in channel width, even if the kink is not generated, the whole area of the device becomes the kink current generation area, and accordingly, there develops a problem in which the threshold voltage is reduced by the so-called inverse narrow-channel effect, as shown in FIG. 13(a).

In the above conventional techniques, the former has the following disadvantages: Namely, as shown in FIG. 10, the impurity concentration of the p-type layer at the channel edge is locally increased, and consequently the kink current is suppressed: however, the junction characteristic between the source and drain diffusion layer and the semiconductor substrate 1 is deteriorated, which brings about the reduction in junction breakdown voltage and the increase in junction leakage current, thereby deteriorating the data retention ability and increasing the stand-by current.

For achieving the high integration of the semiconductor integrated circuit, the impurity concentration of the semiconductor substrate 1 must be increased. However, along with this, it is required to increase the impurity concentration of the p-type layer 15 at the channel edge. Consequently, the above junction characteristic is further deteriorated.

Also, in the latter one of the discussed conventional techniques, the inclination of the side surfaces of the field isolation trench is controlled by scanning the energy beams for excitation in the specified direction. Accordingly, the side surfaces 23, in the specified direction, of the side walls of the trench are necessarily perpendicular to the surface 21 of the substrate, which makes it impossible to take the perfect measure. The reason for this is that the semiconductor integrated circuit device is constituted of a plurality of devices, and gate electrodes 18 in the devices are not necessarily directed in the specified direction. Accordingly, even if the gate electrodes 18 in some devices are crossed to the perpendicular surface, in the other devices, a kink is liable to be generated. This problem is solved by a method of specifying the direction of the gate electrodes of all of the devices; however, in this method, the dimension of the chip is increased due to the restriction of the lay-out, thereby making it difficult to realize this method.

Also, the above devices being narrow in channel width which causes the inverse narrow-channel effect is disadvantageous in that, since they are mainly formed in the memory cell area, the off-current (current flowing when the gate voltage is not applied) of the MOS transistors is increased along with the reduction in the threshold voltage, which brings the deterioration of the memory retention characteristic and the increase in the stand-by current.

DISCLOSURE OF THE INVENTION

A first object of the invention is to solve the above problems of the conventional techniques, and to provide a semiconductor integrated circuit device capable of suppressing the kink current of MOS transistors without deteriorating the junction characteristic of the diffusion layers, and its fabrication method.

A second object is to provide a semiconductor integrated circuit device including semiconductor devices of narrow channel width capable of preventing the reduction in the threshold voltage.

To achieve the first object, according to the present invention, there is provided a semiconductor integrated circuit device including a memory cell area having a plurality of memory devices and an environmental device area (e.g., peripheral area) having a plurality of environmental (peripheral) devices, wherein an angle between the substantially linear part of the lower surface of each edge portion (e.g., bird beak) of the field isolation insulating film formed on the environmental device area and the main surface of the semiconductor substrate is smaller than an angle between the substantially linear part of the lower surface of each edge portion of the field isolation insulating film formed on the memory cell area and the main surface of the semiconductor substrate.

Also, in the present invention, there is provided a semiconductor integrated circuit device including the above memory cell area and the above environmental device area, wherein an angle between the substantially linear part of the lower surface of each edge portion of the field isolation insulating film formed on the environmental device area and the main surface of the semiconductor substrate, is 60° or less.

To achieve the second object, according to the present invention, there is provided a semiconductor integrated circuit device including the above memory cell area and the above environmental device area, wherein an impurity concentration on the surface of the semiconductor substrate in the memory cell area is higher than that on the surface of the semiconductor substrate in the environmental device area.

Also, in the present invention, there is provided a semiconductor integrated circuit device including the above memory cell area and the above environmental device area, wherein the thickness of a gate insulating film formed on the memory cell area is larger than that of a gate insulating film formed on the environmental device area. In this case, the field isolation insulating films may be formed both on the memory cell area and on the environmental device area in the manner as described above.

To achieve the first object, according to a fabrication method for a semiconductor integrated circuit device of the present invention, in a process of selectively oxidizing the exposed portion of a semiconductor substrate using an oxidation-proof insulating film having a specified shape as a mask for forming a field isolation insulating film, the oxidation is performed in such a manner that the extension, in the direction of being substantially parallel to the main surface of the semiconductor substrate, of each edge of the field isolation insulating film formed on an environmental device area, is longer than the extension, in the direction of being substantially parallel to the main surface of the semiconductor substrate, of each edge of the field isolation insulating film formed on a memory cell area.

Also, according to a fabrication method for a semiconductor integrated circuit device of the present invention, in a process of selectively oxidizing the exposed portion of a semiconductor substrate using an oxidation-proof insulating film having a specified shape for forming a field isolation insulating film, the oxidation is performed in such a manner that an angle between the substantially linear part of the lower surface of each edge portion of the field isolation insulating film formed on the environmental device area and the main surface of the semiconductor substrate, is smaller than an angle between the substantially linear part of the lower surface of each edge portion of the field isolation insulating film formed on the memory cell area and the main surface of the semiconductor substrate.

More specifically, according to the fabrication method for a semiconductor integrated circuit device, in the case of forming an oxide film under an oxidation-proof insulating film and then performing the thermal oxidation, the above thermal oxidation may be performed in such a state that the thickness of the oxide film formed in the environmental device area is made larger than that of the oxide film formed in the memory cell area. Also, the oxidation may be performed in the state of forming an oxide film under the oxidation-proof insulating film in the environmental device area while not forming an oxide film under the oxidation-proof insulating film in the memory cell area. Further, the oxidation may be performed in the state of making thinner the thickness of the oxidation-proof insulating film formed in the environmental device area than that of the oxidation-proof insulating film formed in the memory cell area.

Also, the first object can be achieved by forming the field isolation insulating films on the environmental device area and on the memory cell area in the desired order using the respective different methods. For example, the field isolation insulating film for the environmental device area may be formed by performing the local thermal oxidation on the exposed surface of the semiconductor substrate using the oxidation-proof insulating film having the specified shape as a mask, whereas the field isolation insulating film for the memory cell area is formed by providing the trenches at the desired positions of the semiconductor substrate, and burying the trenches with insulators. Preferably, the field isolation insulating film is oxidized in such a manner that an angle between the substantially linear part of the lower surface of each edge portion of the field isolation insulating film and the surface of the substrate is 60° or less.

In each case, to obtain the preferable isolation, the local oxidation may be performed after provision of the trenches of 0.2 μm or more in depth on the surface of the semiconductor substrate. Trenches having a depth of 0.05 to 0.2 μm produce results which are most desirable.

Also, to achieve the second object, according to the present invention, there is provided a fabrication method for a semiconductor integrated circuit device comprising: performing a process of doping impurities in both the environmental device area and the memory cell area and a process of doping impurities only in the memory cell area in a specified order; or performing a process of doping impurities in the environmental device area in a specified amount and a process of doping impurities in the memory cell area in an amount larger than the above specified amount in a specific order, thereby making higher the impurity concentration on the surface of the semiconductor substrate in the memory cell area than that on the surface of the semiconductor substrate in the environmental device area.

To achieve the second object, according to the present invention, there is provided a fabrication method for a semiconductor integrated circuit device, comprising a process of forming a first gate insulating film on the environmental device area and on the memory cell area; a process of removing the portion of the first insulating film formed in the environmental device area; and a process of forming a second insulating film on the environmental device area and the memory cell area, thereby making larger the thickness of the gate insulating film formed in the memory cell area than that of the gate insulating film formed in the environmental device area.

As shown in FIGS. 12(a) and 12(b), the equipotential line 16 of the potential induced by a gate electrode 18 of the MOS transistor is extended up to the deep portion of the field oxide 2; and is distributed on the surface of the semiconductor substrate 1. At the channel edge, the distributions in both the field oxide 2 and the semiconductor substrate I are effected to each other, and thereby the distribution of the equipotential 16 is distorted. In particular, as shown in FIG. 12(a) in the case that the bird beak is short and is greatly inclined, the curvature radius of the potential distribution 16 at the channel edge is small, and the potential is locally increased, which brings the generation of the kink current.

On the contrary, in the structure of extending the bird beak as shown in FIG. 12(b) according to the present invention, the potential distribution 16 at the channel edge is smooth, thereby eliminating the rise in the local potential, which makes it possible to suppress the kink current. Here, the extension of the bird beak means that the shape (inclination) of the bird beak is made smooth.

Also, in the present invention, as described above, the bird beak in the memory cell area is smoother than that in the environmental device area. In the case in which the device is surrounded in its environment by a wide field isolation area and thereby it solely exists, as shown in FIG. 13(a), the threshold voltage of the device is reduced as the channel width becomes narrower. However, as shown in FIG. 13(b), the field isolation length in the environment becomes short, the reduction in the threshold voltage caused by the kink is, therefore, made smaller.

Accordingly, the memory cell area where the active area and the field isolation area are disposed at the minimum pitch has both the characteristics; however, since the effect associated with the isolation length is larger, even if the side surfaces of the field isolation insulating film are perpendicular to the surface of the substrate, the kink is suppressed by making short the field isolation length. Accordingly, the measure for the kink is effective performed for the environmental device area, and in the memory cell area, the reduction in the threshold voltage is occasionally prevented by increasing the impurity concentration of the surface of the substrate or increasing the thickness of the gate insulating film.

BEST MODE FOR CARRYING OUT THE INVENTION

Figure 1A:
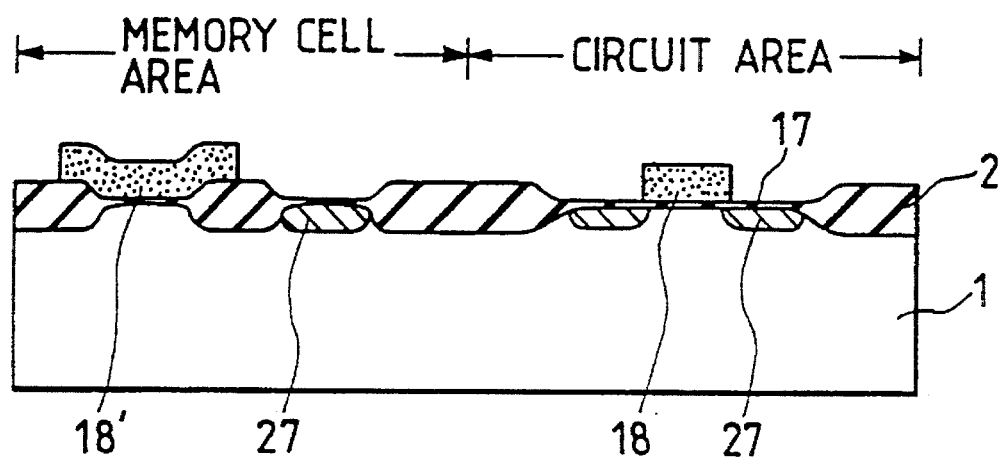
FIG. 1(a) is a view showing the sectional structure of a field oxide of the present invention.

Hereinafter, embodiments of the present invention will be described in detail with reference to the accompanying drawings. FIG. 1(a) shows the sectional structure of a semiconductor integrated circuit device of the present invention, wherein gate electrodes 18 and 18', and source and drain diffusion layers 27 are formed. In this figure, the right side shows an environmental device area (peripheral area), in which each end or the bird beak of a field oxide 2 formed on a main surface of a semiconductor substrate 1 has a smooth shape (inclination) as compared with a memory cell area shown in the left side.

Figure 1B:
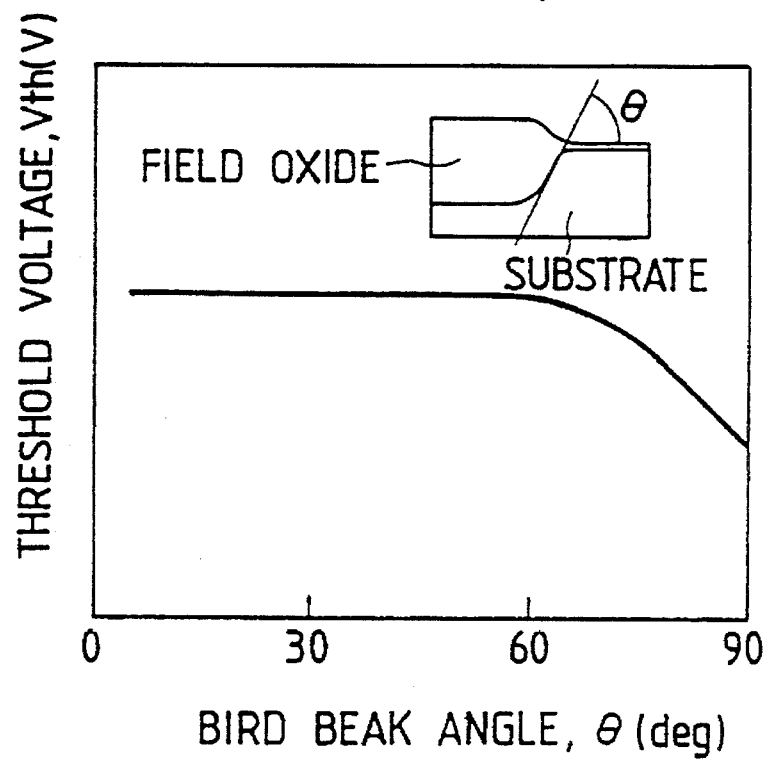
FIG. 1(b) is a view showing one form of the characteristics thereof.

The effect of such a shape will be described with reference to FIG. 1(b). FIG. 1(b) shows the relationship between an angle of the lower surface of each bird beak of the field oxide 2 to the surface of the substrate 1 and a change in the threshold voltage of the MOS transistor. If the bird beak angle exceeds 60°, the kink is generated, and thereby the threshold voltage is reduced. Accordingly, this angle is reduced to be 60° or less by extension of the bird beak (that is, smoothing the inclination of the bird beak), which makes it possible to prevent the kink, and hence to keep the threshold voltage at the higher level. The method of realizing this structure will be described below.

<Example 1>

First, there will be described the case of changing the film thickness of an oxide film formed under an oxidation-proof insulating film serving as a mask in performing local oxidation.

Figure 2A:
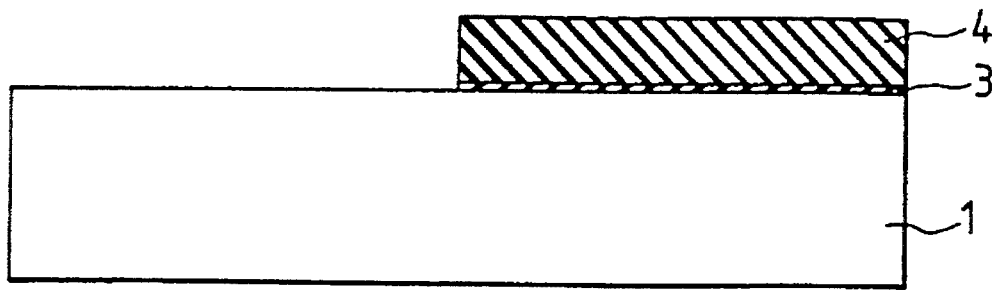
FIGS. 2(a) to 2(d) are sectional views showing fabrication processes in Example 1 of the present invention.

FIGS. 2(a) to 2(d) show sectional views showing fabrication processes employed in Example 1 of the present invention. First, as shown in FIG. 2(a), an oxide film 3 of about 10 nm thick is formed on the main surface of a semiconductor substrate 1 having an impurity concentration of $10^{17}/cm^3$ by thermal oxidation. Next, an environmental device area is covered with a photoresist pattern 4, and the oxide film 3 formed on a memory cell area is removed using the photoresist pattern 4 as a mask.

Figure 2B:
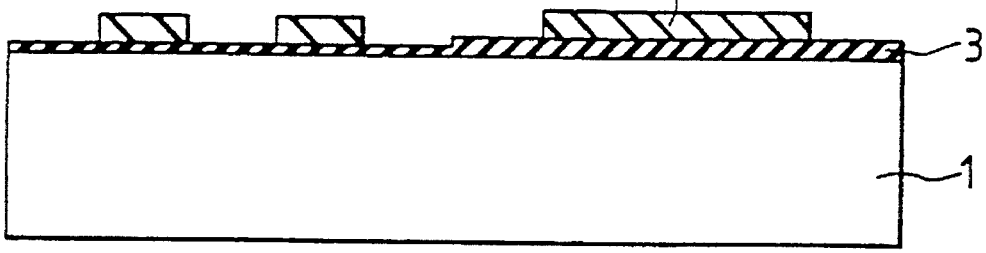

After removal of the above photoresist pattern 4, as shown in FIG. 2(b), an oxide film of about 10 nm thick is formed on the memory cell area by performing the thermal oxidation again. Thus, the oxide film 3 formed on the main surface of the semiconductor substrate 1 has a thickness of 10 nm in the memory cell area, and a thickness of about 14 nm in the environmental device area.

A silicon nitride film 5 of about 150 nm thick serving as an oxidation-proof insulating film is formed by chemical vapor deposition. The silicon nitride film 5 is then subjected to patterning using known lithography and dry etching, to be removed in a field isolation area. Consequently, the oxide film 3 formed under the silicon nitride film 5, which serves as a mask in performing local oxidation, becomes thicker in the environmental device area than in the memory cell area.

Figure 2C:
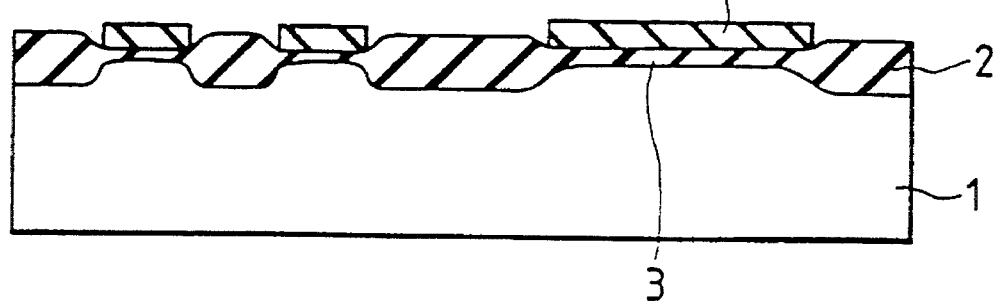

Next, as shown in FIG. 2(c), a field oxide 2 of about 400 nm thick is formed on the field isolation area by local oxidation using the silicon nitride film 5 as a mask. This makes it possible to enlarge the length of each bird beak of the field oxide 2 in the environmental device area more than that of each bird beak of the field oxide 2 in the memory cell area.

Figure 2D:
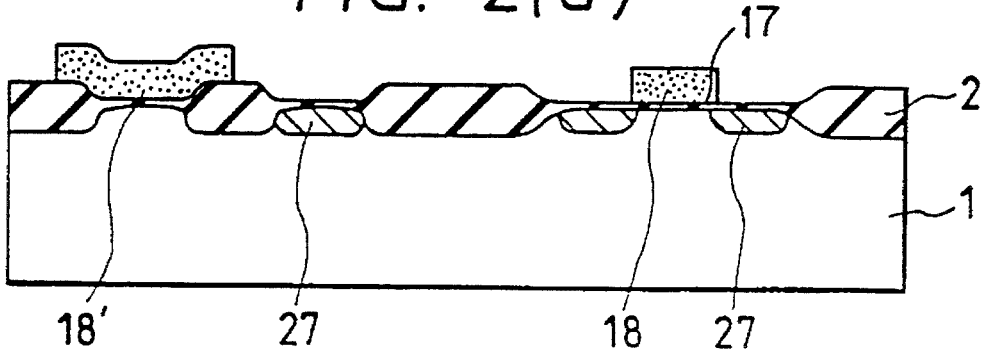

The reason for this is that, since the thickness of the oxide film 3 formed under the silicon nitride film 5 in the environmental device area is larger, the passage of an oxidizer (oxygen) is broadened which causes the oxidizer to easily diffuse to the inner portion. In accordance with the conventional fabrication method for a MIS (Metal Insulator Semiconductor) field effect transistor, the silicon nitride film 5 is selectively removed by boiled $H_3PO_4$. After that, as shown in FIG. 2(d), a gate insulating film 17 is formed, and subsequently gate electrodes 18 and 18', and source and drain diffusion layers 27 are formed on the main surface of the semiconductor substrate 1. Thereafter, dielectric films and metal electrodes etc. will be formed; however, they are not directly related to the present invention and thus the explanation thereof is omitted.

The oxide film 3 may be formed on the main surface of the semiconductor substrate 1 by chemical vapor deposition. According to this example, in the field oxide 2 formed in the memory cell area side, the lateral extension at each end is about 0.1 μm, and an angle between the lower surface of the end and the main surface of the substrate 1 (hereinafter, referred to as lower surface angle) is about 70°. Meanwhile, in the field oxide 2 formed in the environmental device area, the lateral extension at each end is about 0.3 μm, and the lower surface angle is about 50°.

<Example 2>

Figure 3A:
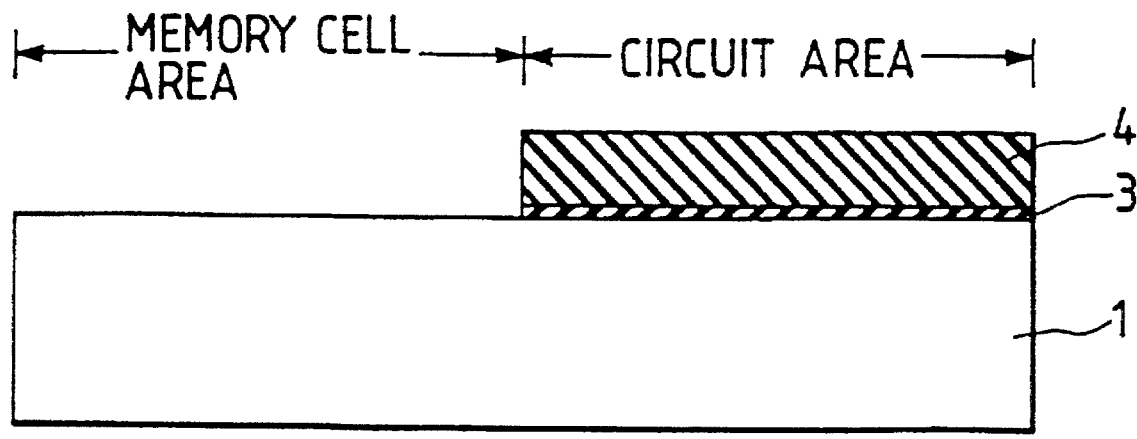
FIGS. 3(a) to 3(c) sectional views showing fabrication processes in Example 2 of the present invention.
Figure 3B:
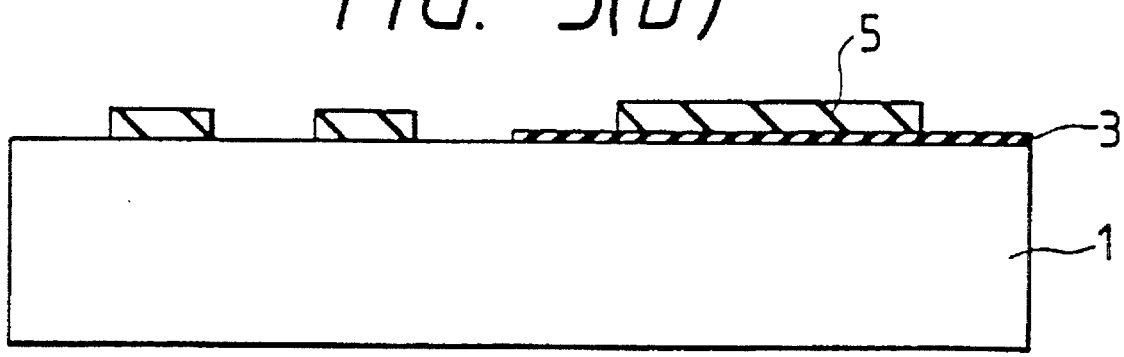
Figure 3C:
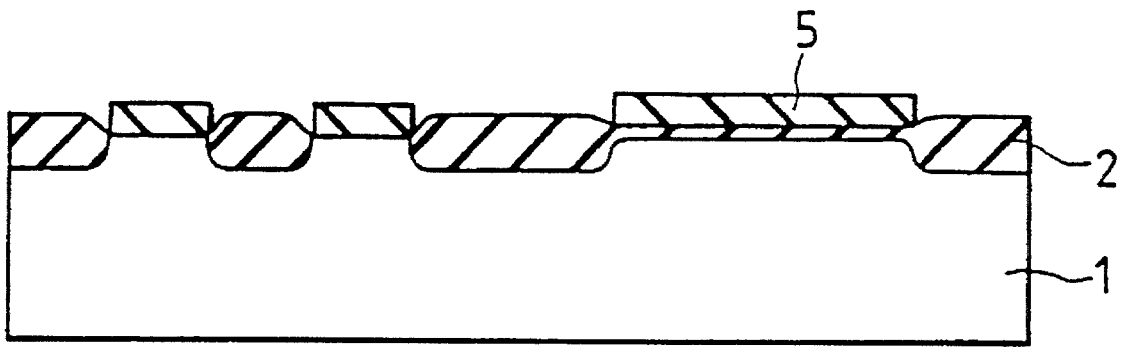

FIGS. 3(a) to 3(c) are sectional views showing manufacturing processes in Example 2 of the present invention. This example is nearly the same as Example 1 as shown in FIGS. 2(a) to 2(d), except for eliminating the formation of the oxide film under the silicon nitride film 5 in the memory cell area, as shown in FIG. 2(b). Consequently, as shown in FIG. 3(b), the oxide film 3 is not present under the silicon nitride film 5 in the memory cell area.

In this example, as shown in FIG. 3(c), when the thickness of the oxide film 3 is 10 nm, the lateral extension (length of the bird beak) at each end of the field oxide 2 is about 0 μm in the memory eels area, and is about 0.1 μm in the environmental device area. Namely, the lateral extension of the field oxide 2 in each area can be reduced as compared with Example 1. However, in this case, since an angle between the substantially linear part of the lower surface of the bird beak and the main surface of the substrate in the environmental device area becomes about 70°, the kink cannot be suppressed. However, when the thickness of the oxide film 3 in FIG. 3(a) is formed to be about 14 nm, the lateral extension at each end of the field oxide 2 is about 0 μm in the memory cell area and is about 0.3 μm in the environmental device area, and an angle between the substantially linear part of the lower surface of the bird beak and the main surface of the substrate is about 90° in the memory cell area and is about 50° in the environmental device area, and consequently the kink can be suppressed. The subsequent fabricating processes are the same as in Example 1, and the explanation thereof is omitted.

<Example 3>

Figure 4A:
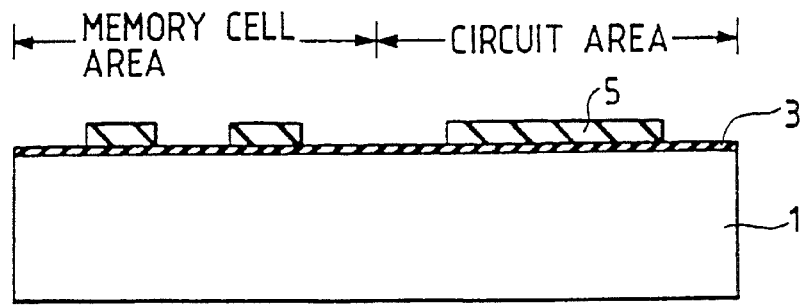
FIGS. 4(a) to 4(c) are sectional views showing fabrication processes in Example 3 of the present invention.
Figure 4B:
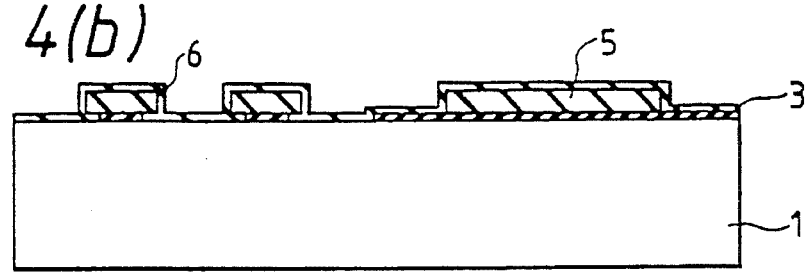
Figure 4C:
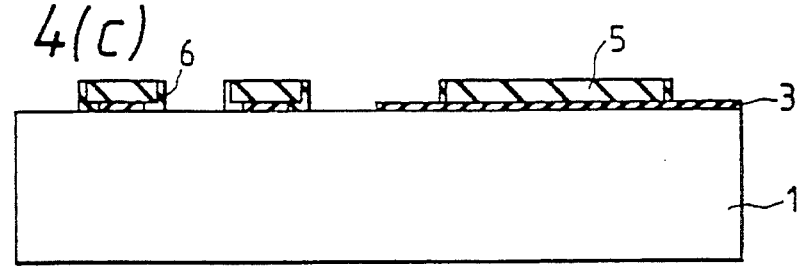

FIGS. 4(a) to 4(c) are sectional views showing fabrication processes in Example 3 of the present invention. First, as shown in FIG. 4(a), an oxide film 3 of about 15 nm thick is formed on the main surface of a semiconductor substrate 1 with an impurity concentration of about $10^{17}/cm^3$ by known thermal oxidation. Subsequently, a silicon nitride film 5 of 150 nm thick serving as an oxidation-proof insulating film is formed by chemical vapor deposition. The silicon nitride film 5 is then subjected to patterning by known lithography and dry etching, to be thus removed in a field isolation area.

An environmental device area is covered with a photoresist film (not shown), and the exposed portion of the oxide film 3 in the field isolation area of a memory cell area is removed by etching using diluted HF solution etc. At this time, the oxide film 3 under the environmental portion of the silicon nitride film 5 formed on the memory cell area is also removed. The above photoresist film is removed, and a thin silicon nitride film 6 having a thickness or 20 nm equivalent to more than one-half of that of the above removed oxide film 3 is formed, thus forming the structure as shown in FIG. 4(b). In this case, if the thickness of the thin silicon nitride film 6 is less than one-half of that of the oxide film 3, a gap is unfavorably generated between the silicon nitride film 5 and the semiconductor substrate 1.

Next, as shown in FIG. 4(c), the thin silicon nitride film 6 is removed by anisotropic dry etching in such a manner as to remain only on the side walls of the silicon nitride film 5 serving as the mask for local oxidation. Consequently, in the memory cell area, the silicon nitride film 6 is directly contacted with the semiconductor substrate 1, and in the environmental device area, the oxide film 3 is present under the silicon nitride film 6. With this construction, by local oxidation, the lateral extension of the field oxide in the memory cell area is, as shown in Example 2, about 0 μm and an angle between the lower surface and the main surface of the substrate is about 90°. In the environmental device area, the above lateral extension is about 0.3 μm and an angle between the lower surface and the main surface of the substrate is about 50°. The subsequent fabricating processes are the same as in Example 1, and the explanation thereof is omitted.

The difference between this example and Example 2 lies in that the silicon nitride film 5 in the memory cell area is directly contacted only at the environment with the semiconductor substrate 1 through the thin silicon nitride film 6. In general, for removal of the silicon nitride film after formation of the field oxide, the boiled $H_3PO_4$ is used. The boiled $H_3PO_4$ is very low in the etching selectivity for the silicon substrate 1 with respect to the silicon nitride, and thus tends to only slightly etch the silicon substrate 1 which is in direct contact with the silicon nitride film in the memory cell area.

However, in this example, after removal of the silicon nitride films 5 and 6, the exposed surface of the semiconductor substrate is only the environment of the silicon nitride film 5 in the memory cell area, thereby suppressing the etching of the silicon substrate 1 by the boiled $H_3PO_4$ at minimum.

Also, in this example, prior to formation of the thin silicon nitride film 6 as shown in FIG. 4(b), for example, by performing a treatment at 900° for 20 min. in a nitrogen ambient, the native oxide film formed on the exposed surface of the semiconductor substrate 1 is transformed into a thermal silicon nitride film. This makes it possible to prevent the native oxide film from being interposed at the boundary between the thin silicon nitride film 6 and the semiconductor substrate 1, and hence to further reduce the lateral extension of the field oxide at the memory cell area. However, in transformation of the native oxide film into the thermal silicon nitride, the oxide film 3 in the field isolation area of the environmental device area is sufficiently thicker than the native oxide film, and thereby the oxide film 3 is not all transformed into the thermal silicon nitride film.

<Example 4>

Lateral overhangs may be formed onto the thin silicon nitride film 6 as shown in Example 3. This will be described with reference to FIGS. 5(a) and 5(b).

Figure 5A:
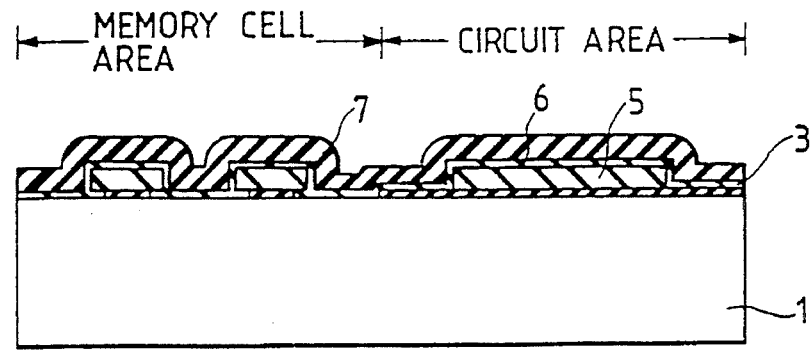
FIGS. 5(a) and 5(b) are sectional views showing fabrication processes in Example 4 of the present invention.

In this example, in the process as shown in FIG. 4(b), prior to the anisotropic etching of the silicon nitride film 6, an oxide film 7 of about 150 nm thick is formed using chemical vapor deposition as shown in FIG. 5(a).

Figure 5B:
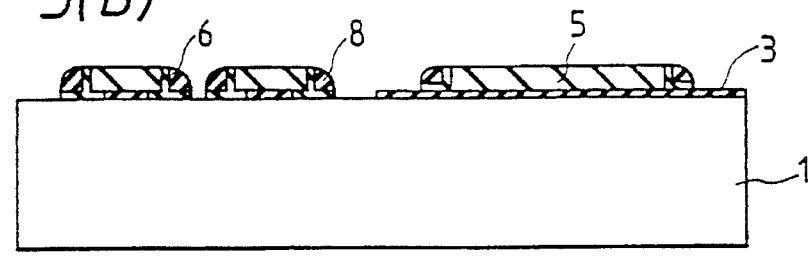

Subsequently, as shown in FIG. 5(b), the oxide film 7 is subjected to anisotropic etching, and the thin silicon nitride film 6 is etched using an oxide film 8, remaining on the side walls of the silicon nitride film 6 as a mask, thereby forming an overhangs of the thin silicon nitride film 6 or about 0.1 µm in length on the side walls or the silicon nitride film 5. In performing the field oxidation, the oxide film 8 on the side walls of the silicon nitride film 6 is removed using diluted HF solution etc. At this time, in the environmental device area, the exposed oxide film 3 under the thin silicon nitride film 6 is etched; however, the oxide film 8 formed using chemical vapor deposition is etched at an etching rate several times as large as in the oxide film 3 formed by thermal oxidation, so that the oxide film 3 remains without much etching.

In this example, as described above, prior to formation of the thin silicon nitride film 6, the native oxide film formed on the surface of the semiconductor substrate 1 is transformed into a thermal nitride film. This is effective to reduce the lateral extension of the field oxide in the memory cell area. According to this example, it is possible to reduce the lateral extension of the field oxide in the memory cell area to be 0 µm. Meanwhile, in the environmental device area, due to the overhangs of the silicon nitride film 6, the extension is about 0.2 µm, and the lower surface angle is about 50°.

Also, prior to formation of the field oxide by local oxidation, at least in the memory cell area, trenches of 0.1 µm in depth are selectively formed on the semiconductor substrate 1, from which the field isolation area is exposed, using the silicon nitride film 5 as a mask, which makes it possible to improve the field isolation ability. The same is true for the other examples of the present invention. When the depth of the above trenches is 0.2 µm or more, the crystal defects are liable to be generated in formation of the field oxide. Accordingly, the depth of the trenches is preferably within the range of less than 0.2 µm.

As shown in Examples 1 to 4, the lateral extension (angle of the bird beak) of the field oxide can be controlled to be the desired value by changing the thicknesses of the silicon nitride film 5 and the oxide film 3 under the same, or the thickness of the field oxide 2 and the temperature of the thermal oxidation in formation the field oxide 2.

<Example 5>

This example shows the case of changing the thickness of an oxidation-proof insulating film serving as a mask in local oxidation.

Figure 6A:
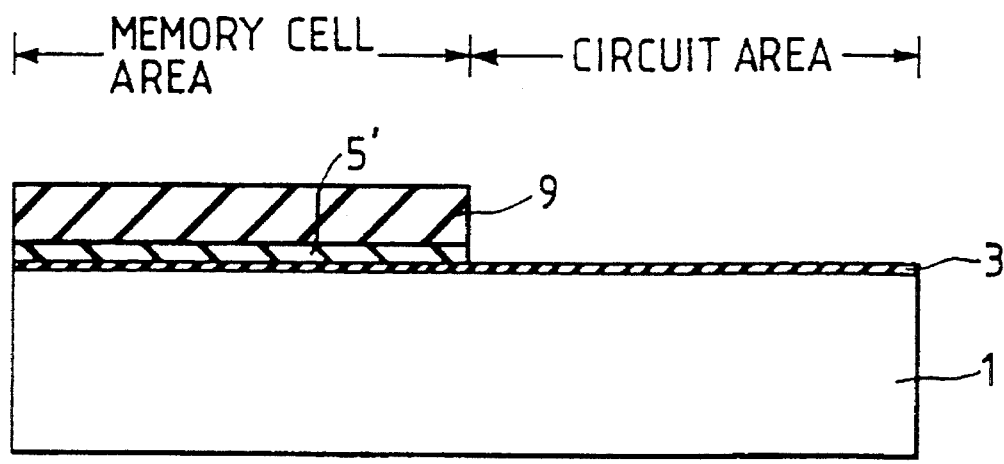
FIGS. 6(a) to 6(c) are sectional views showing fabrication processes in Example 5 of the present invention.

As shown in FIG. 6(a), an oxide film 3 of 10 nm thick is formed on the main surface of a semiconductor substrate 1 with an impurity concentration of about $10^{17}/cm^3$ by thermal oxidation and, subsequently, a silicon nitride film 5' of about 100 nm thick is formed by chemical vapor deposition. Next, a memory cell area is covered with a photoresist pattern 9, and a silicon nitride film 5 in an environmental device area is removed using the photoresist pattern 9 as a mask.

Figure 6B:
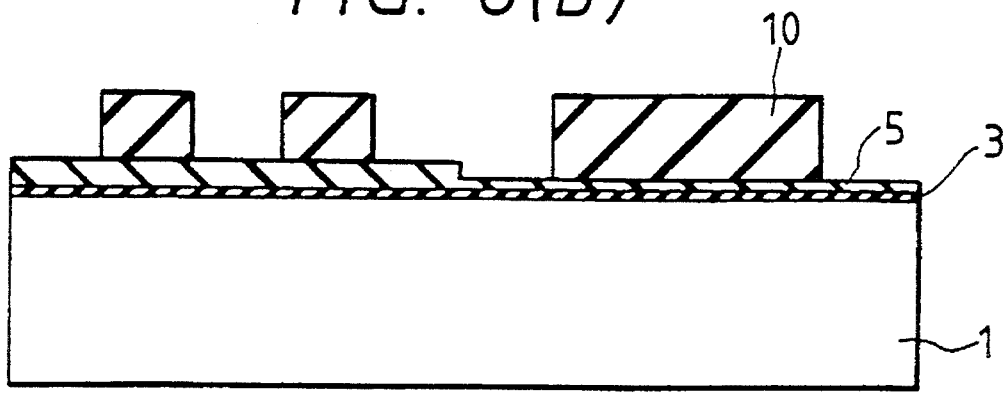

As shown in FIG. 6(b), a silicon nitride film of about 100 nm thick is further formed, as a result of which the thickness of the silicon nitride film 5 becomes 200 nm in the memory cell area and 100 nm in the environmental device area. A photoresist pattern 10 is formed on the above silicon nitride film 5 and the exposed portion of the silicon nitride film 5 in the field isolation area is removed using the silicon nitride film 5 as a mask.

Figure 6C:
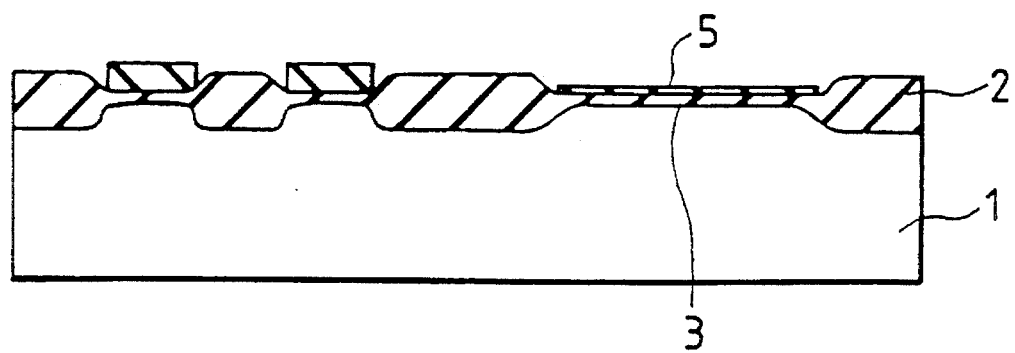

After removal of the above photoresist pattern 10, as shown in FIG. 6(c), specified portions of the semiconductor substrate 1 are subjected to local thermal oxidation, to form a field oxide 2 in the field isolation area. At this time, since in the environmental area, the thickness of the silicon nitride film 5 serving as a mask for local oxidation is thinned to be 100 nm, the effect to suppress the lateral extension of the field oxide is small. Namely, in the field oxide, the lateral extension at each end is about 0.3 µm, and an angle between the lower surface and the surface of the substrate is about 50°. On the contrary, in the memory cell area, since the thickness of the silicon nitride film 5 serving as a mask for local oxidation is thickened to be 200 nm, the lateral extension of the field oxide is effectively suppressed. Namely, in the field oxide, the extension at each end is about 0.1 µm, and an angle between the lower surface and the surface of the substrate is about 70°. As a result, the extension in the memory cell area is much smaller than that in the environmental device area. The subsequent fabrication processes are the same as in Example 1, and therefore, the explanation thereof is omitted.

<Example 6>

Figure 7A:
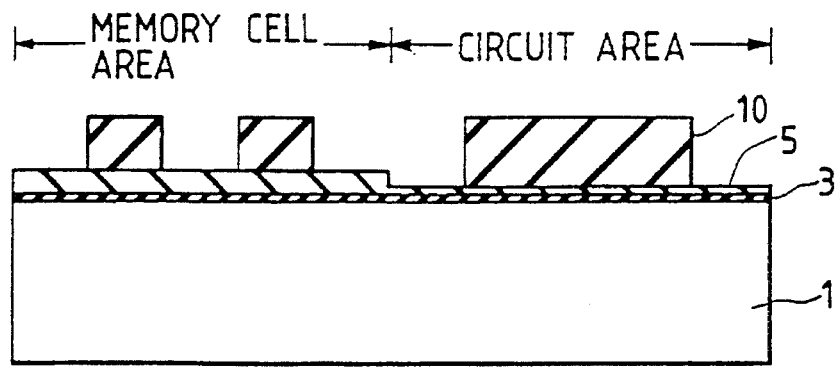
FIGS. 7(a) to 7(e) are sectional views showing fabrication processes in Example 6 of the present invention.
Figure 7B:
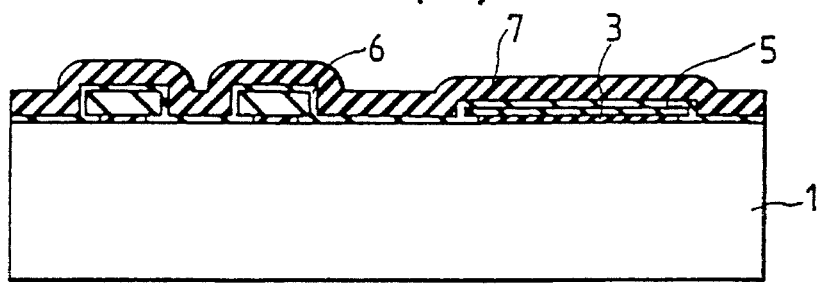
Figure 7C:
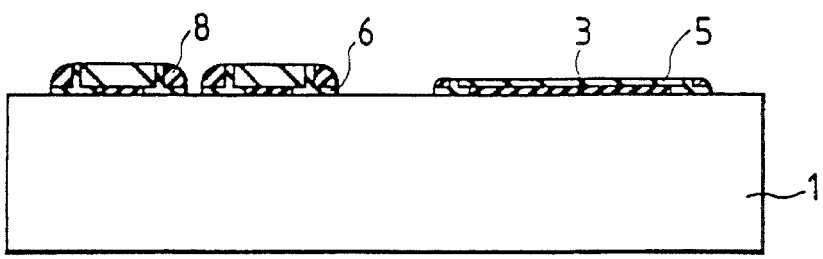

The processes until the patterning of the silicon nitride film 5 as shown in FIG. 7(a) are the same as those until in FIG. 6(b) in Example 5. Next, the exposed portion of the oxide film 3 formed in the field isolation area is removed using diluted HF solution. After that, a thin silicon nitride film 6 having a thickness of 20 nm more than one-half of the above oxide film 3, as shown in FIG. 7(b) is formed, and subsequently, an oxide film 7 of about 150 nm thick is formed by chemical vapor deposition. As shown in FIG. 7(c), the above thick oxide film 7 is subjected to anisotropic dry etching for causing the oxide film 8 to remain only on the side walls of the silicon nitride film 6. Further, the above thin silicon nitride film 6 is etched using the remaining oxide film 8 as a mask. This process is the same as in Example 4 in FIG. 5(b).

Figure 7D:
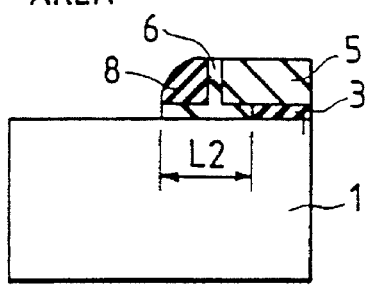
Figure 7E:
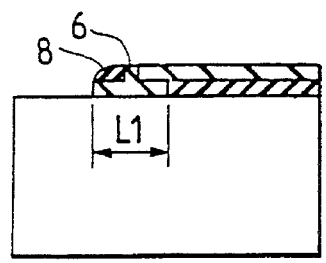

At this time, since the thicknesses of the silicon nitride film 5 are different from each other between the memory cell area and the environmental device area, the lateral overhang (portion of the silicon nitride film 6 directly contacted with the semiconductor substrate 1) of the thin silicon nitride film 6 is made longer in the memory cell area as compared with that in the environmental device area. Consequently, the sectional length in the area of the thin silicon nitride film 6 directly contacted with the semiconductor substrate 1 is, as shown in FIGS. 7(d) and 7(e), is L1 in the environmental device area, and is L2 in the memory cell area. Accordingly, in formation of the field oxide by local thermal oxidation, the lateral extension is made longer than L1 and shorter than L2, which makes it possible to lengthen the lateral extension of the field oxide in the environmental device area without enlarging the lateral extension of the field oxide in the memory cell area. The reason for this is that the thin silicon nitride film 6 is contacted with the semiconductor substrate 1 crossing the directly contacted area, so that the end of the bird beak is liable to be extended. In the environmental device area, since the silicon nitride film 5 serving as a mask for local oxidation is thinned, the lateral extension of the field oxide is liable to be further easily generated. The subsequent processes after forming the field oxide are the same as in Example 1, and therefore, the explanation thereof is omitted.

According to this example, it is possible to change not only the thickness of the silicon nitride film 5 serving as a mask for local oxidation but also the overhangs of the thin silicon nitride film 6, and hence to effectively form the bird beaks having different shapes.

< Example 7>

Figure 8A:
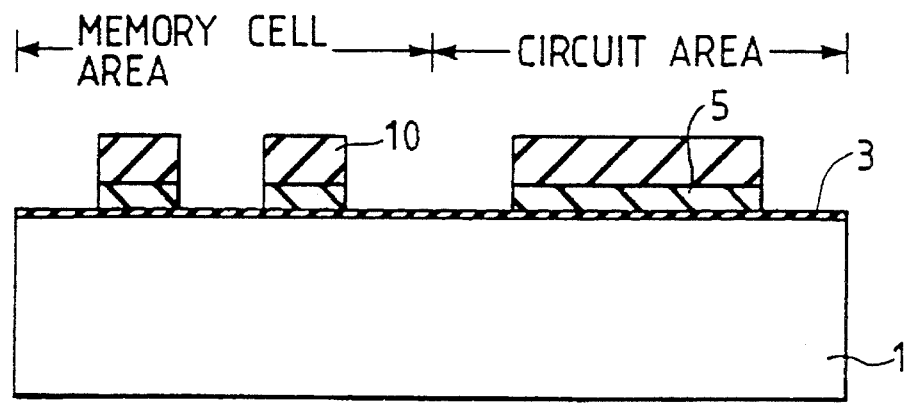
FIGS. 8(a) to 8(d) are sectional views showing fabrication processes in Example 7 of the present invention.

First, as shown in FIG. 8(a), an oxide film 3 of about 10 nm thick is formed on the main surface of a semiconductor substrate 1 with an impurity concentration of $10^{17}/cm^3$ by thermal oxidation, and subsequently, a silicon nitride film 5 of about 200 nm thick is deposited by chemical vapor deposition. Subsequently, the silicon nitride film 5 in a field isolation area is removed by etching using a photoresist film 10 as a mask.

Figure 8B:
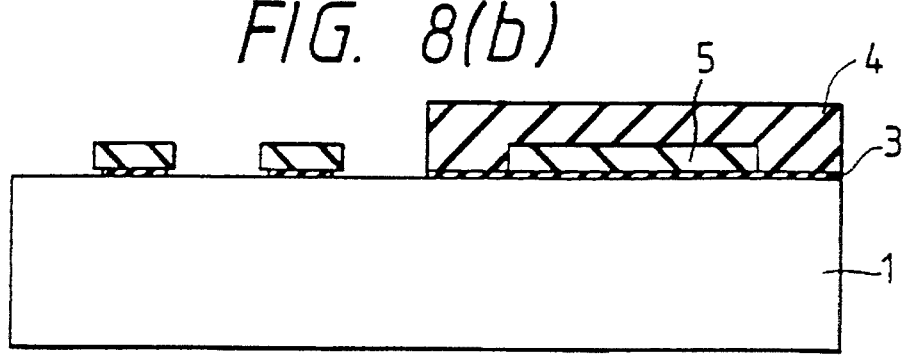
Figure 8C:
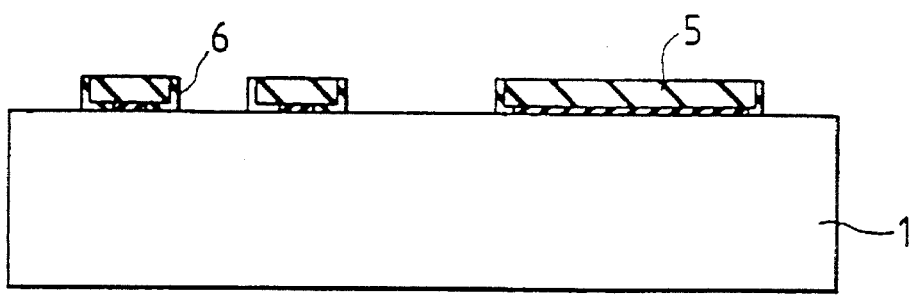

As shown in FIG. 8(b), after an environmental device is covered with a photoresist film 4, and the exposed portion of the oxide film 3 in a memory cell area is removed by diluted HF solution etc. The photoresist film 4 is removed, and the whole surface is etched by diluted HF solution, to thereby remove the oxide film 3 exposed in the environmental device area. At this time, in the environmental area, the etching of the oxide film 3 proceeds to the lower deep portion of the silicon nitride film 5 as compared with the environmental device area. The reason for this is that the etching by diluted HF solution is isotropic, and thereby the etching time in the memory cell area is longer. In this case, if the etching of the oxide film 3 only in the memory cell area is reversed in order by the whole etching of the oxide film 3, the same effect can be obtained.

As shown in FIG. 8(e), after the thin silicon nitride film 6 is formed, the anisotropic dry etching is performed to remove the thin silicon nitride film 6 in the field isolation area. At this time, the length of the area where the remaining silicon nitride film 6 is directly contacted with the semiconductor substrate 1 is 0.1 μm in the memory cell area, and is longer than the value of 0.05 μm in the environmental device area. This length can be controlled by changing the etching condition using the diluted HF solution.

For forming the structure including the overhangs of the thin silicon nitride film 6 on the side walls of the silicon nitride film 5, the technique as shown in FIGS. 7(a) to 7(e) in Example 6 may be used. However, in this case, since the silicon nitride film 5 has the same thickness in the memory cell area and in the environmental device areas, the lengths of the overhangs in both the areas are similar to each other.

Figure 8D:
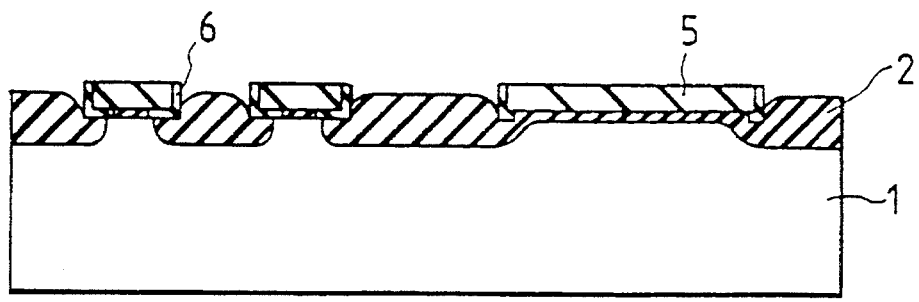

As shown in FIG. 8(d), the local oxidation is made using the silicon nitride film as a mask, to form a field oxide 2 in the field isolation area. The area where the thin silicon nitride film 6 is directly contacted with the semiconductor substrate 1 is 0.1 μm in the memory cell areas, and is made longer than the value of 0.05 μm in the environmental device area. Accordingly, in the same manner as in Example 6, by adjustment of the condition of the field oxidation, for example, by adjustment or the extension of the bird beak in the memory cell area to be 0.07 μm, it is possible to lengthen the lateral extension of the field oxide in the environmental device area while suppressing the lateral extension of the field oxide in the memory cell area.

<Example 8>

In the above examples, the field oxide is formed by local oxidation both in the memory cell area and in the environmental device area. On the contrary, this example shows the case of changing the formation of the field isolation between the memory cell area and the environmental device area.

Figure 9A:
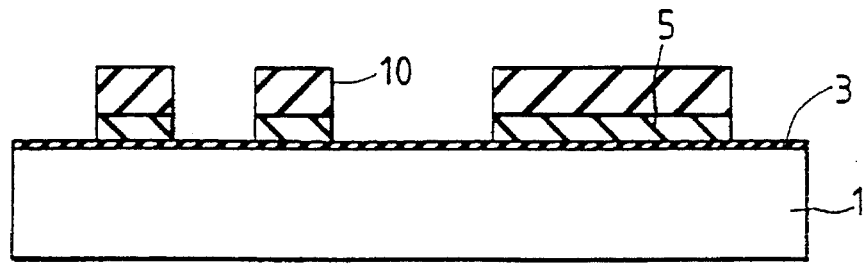
FIGS. 9(a) to 9(e) are sectional views showing fabrication processes in Example 8 of the present invention.

First, as shown in FIG. 9(a), an oxide film 3 of about 15 nm thick is formed on the main surface of a semiconductor substrate 1 with an impurity concentration of $10^{17}$ /cm$^3$ by thermal oxidation, and subsequently, a silicon nitride film 5 of about 200 nm thick is formed by chemical vapor deposition. The exposed portion of the silicon nitride film 5 in the field isolation area is removed by dry etching using a photoresist film 10 as a mask.

Figure 9B:
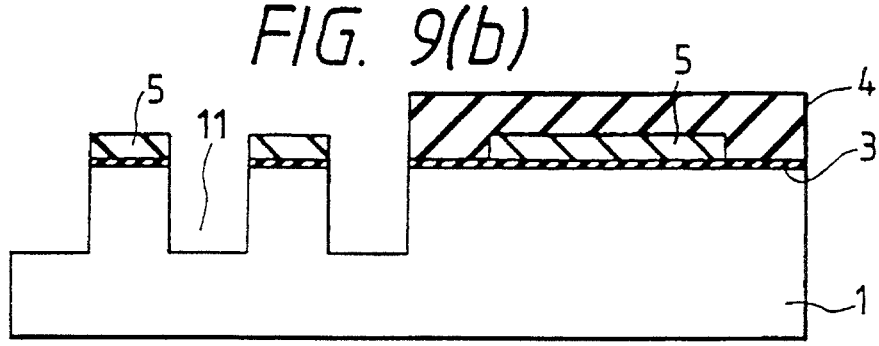

As shown in FIG. 9(b), an environmental device area is covered with a photoresist film 6, the exposed portion of the oxide film 3 in the memory cell area is removed using the photoresist film 4 and the silicon nitride film 5 formed in the memory cell area as masks, thereby exposing the surface of the semiconductor substrate 1. Further, the exposed surface of the semiconductor substrate 1 is etched, to thus form trenches 11 of about 0.5 μm in depth in the field isolation area.

Figure 9C:
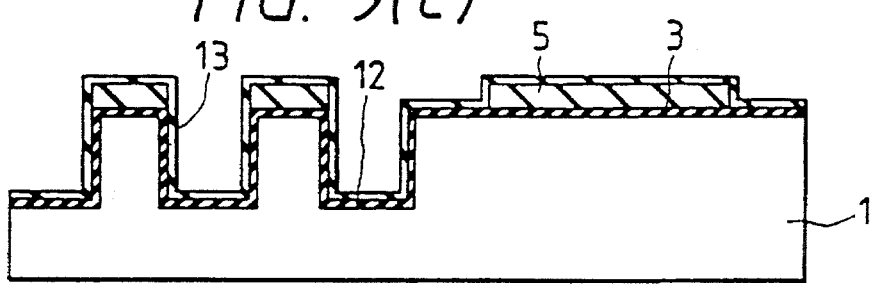

After removal of the above photoresist film 4, as shown in FIG. 9(c), the thermal oxidation is made at a temperature of about 1000° C., to form a thermal oxide film 12 of about 20 nm thick within each trench 11. Further, a silicon nitride film 13 of about 50 nm thick is formed on the whole surface by chemical vapor deposition.

Figure 9D:
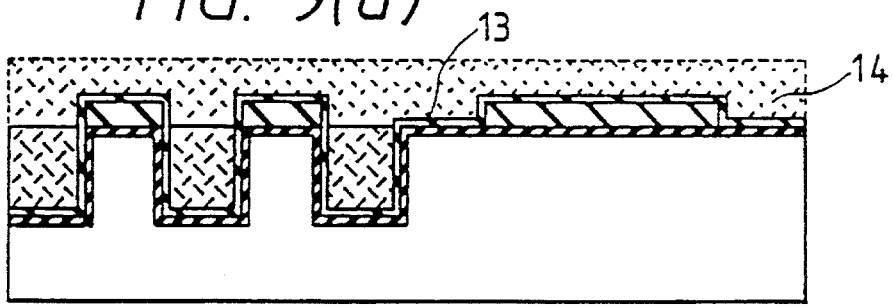

As shown in FIG. 9(d), after an insulating film 14 composed of phosphate glass having excellent thermal fluidity is formed to a thickness of 1.0 μm, a treatment is made at a temperature higher than the maximum temperature used in the subsequent processes for causing the previously formed insulating film 14 to flow, thereby making flat the surface. Next, the whole surface is subjected to etch-back, and the above insulating film 14 is etched until the above silicon nitride film 13 formed on in the field isolation area of the environmental device area is exposed. In addition, the etch-back is the known technique, and thus the explanation thereof is omitted.

Figure 9E:
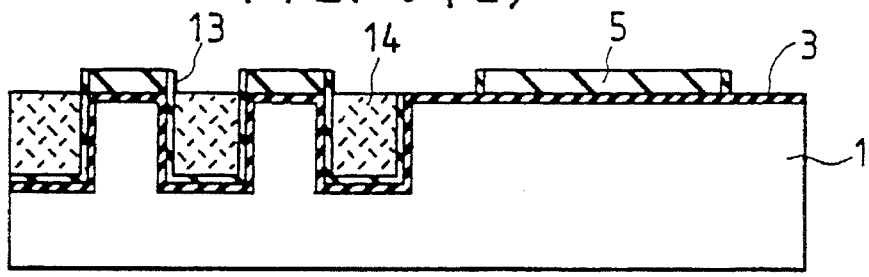
Figure 10:
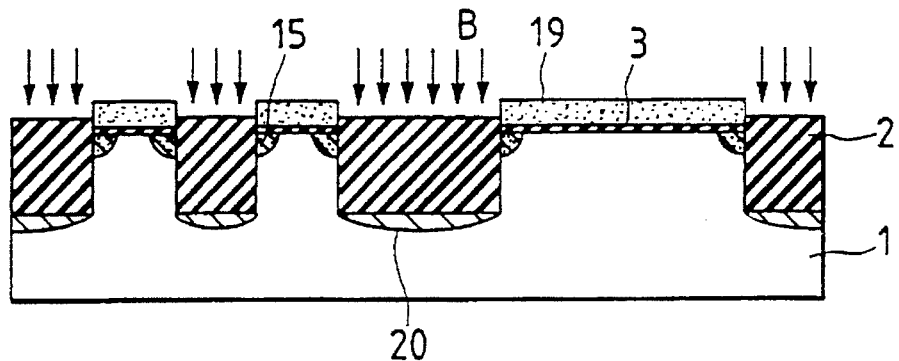
FIG. 10 is a sectional view showing a first conventional scheme for overcoming the kink.
Figure 11:
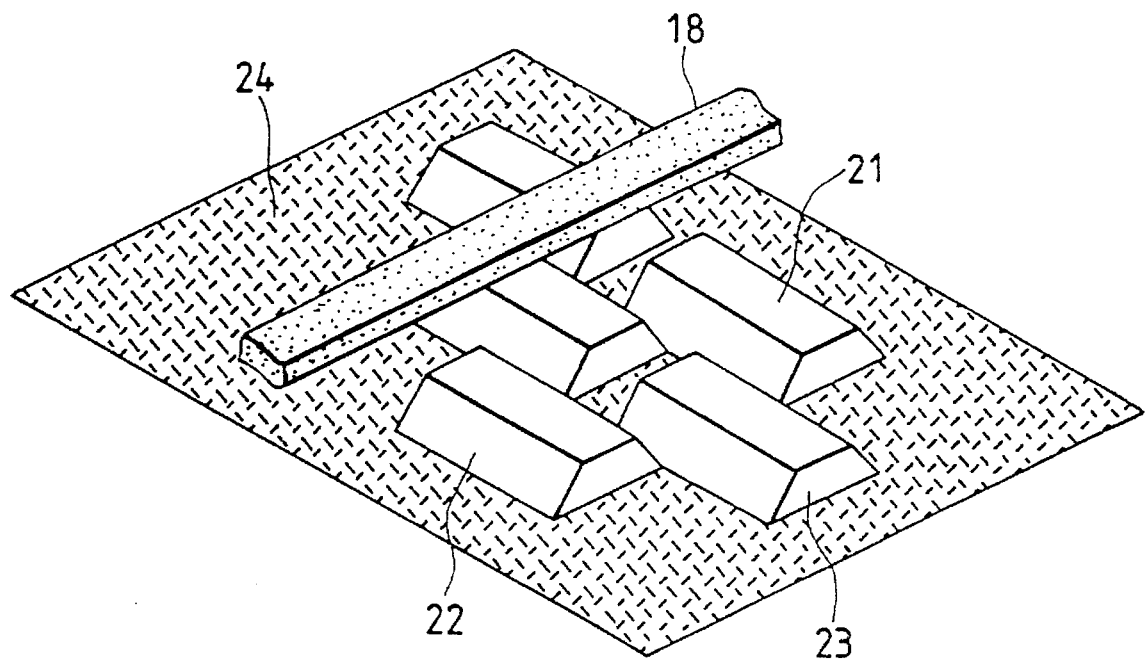
FIG. 11 is a schematic view showing a second conventional scheme for overcoming the kink.
Figure 12A:
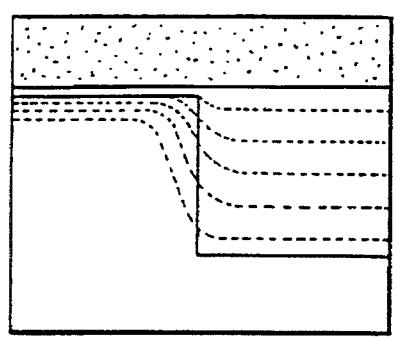
FIGS. 12(a) and 12(b) are views for explaining the effect of the shape of the field oxide on the potential distribution.
Figure 12B:
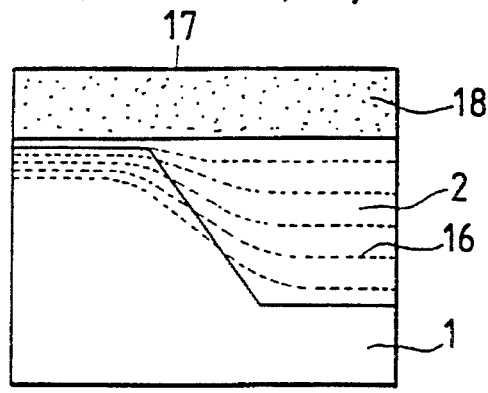

Thus, as shown in FIG. 9(e), the insulating film 14 remains only inside the trenches formed in the field isolation device area of the memory cell area. After that, the silicon nitride film 13 is etched by anisotropic dry etching, to remove a thin silicon nitride film 13 formed in the field isolation area of the environmental device area for exposing the oxide film 3, and thus the field oxide is formed by local oxidation using the silicon nitride film 5 as a mask. At this time, the field oxide is formed in the field isolation area of the environmental device area where the oxide film 3 is exposed; however, since the memory cell area is covered with the nitride film 5 and the thin nitride film 13 as oxidation-proof insulating films, the field oxide is not formed by local oxidation. The subsequent processes are the same as the other examples, and therefore, the explanation thereof is omitted.

According to this example, it is possible to form the field oxide only in the environmental device area, and to make the lateral extension of the field oxide present only in the environmental device area. Consequently, the lower surface angle of the field oxide in the environmental device area is about 50° similarly to the other examples described above, and in the memory cell area, the lower angle (inclination) of the field oxide is determined by the shape of the trench.

The above example is intended to extend the bird beak in the environmental device area where the kink is generated. Meanwhile, in the memory cell area, the kink is not generated; but there occurs such a problem that the threshold voltage is reduced by the inverse narrow channel effect. Hereinafter, there will be described such an example as preventing the reduction in the threshold voltage of the devices having the narrow channel width in the memory cell area.

<Example 9>

Figure 14A:
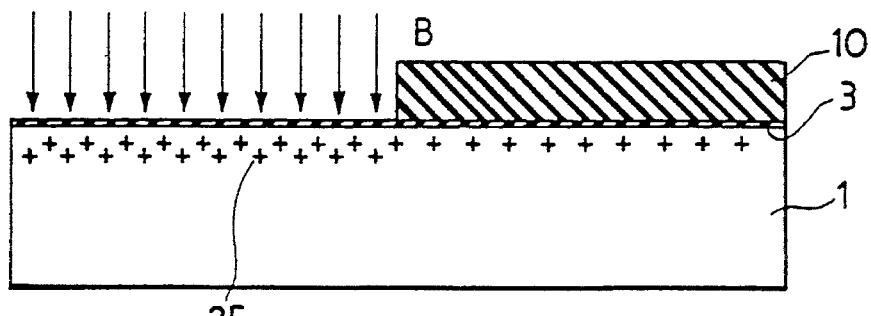
FIGS. 14(a) to 14(c) are sectional views showing the fabrication processes in Example 9 of the present invention.

First, as shown in FIG. 14(a), an oxide film 3 or about 15 nm thick is formed on the main surface of a semiconductor substrate 1 with an impurity concentration of $10^{15}/cm^3$ by thermal oxidation, and boron ions of about $1\times10^{13}/cm^2$ are implanted on the whole surface with an implanting energy of about 20 keV. Next, the environmental device area is covered with a photoresist film 10 of about 1 μm thick, and boron ions of about $2\times10^{13}/cm^2$ are implanted with an implanting energy of about 20 keV in the memory cell area. Consequently, the implanted amount of impurities 25 on the surface of the semiconductor substrate 1 is larger in the memory cell area as compared with the environmental device area by $2\times10^{13}/cm^2$. The ion implanting processes may be reversed in order.

Figure 14B:
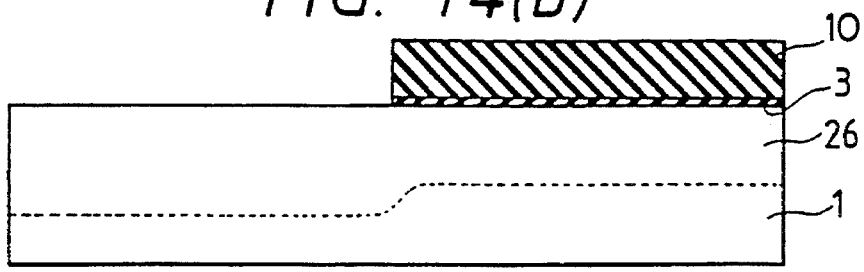

Next, as shown in FIG. 14(b), the above photoresist film 10 is removed, and the impurities 25 are diffused within the semiconductor substrate 1 by a treatment at 1200° C. for about 4 hrs., to thus form an impurity layer 26. As a result, the impurity concentration on the surface of the semiconductor substrate 1 becomes higher in the memory cell area by about 2.5 times as compared with the environmental device area. Further, the environmental device area is covered again with a photoresist film 1 of 1 μm thick, and the oxide film 3 within the memory cell area is removed.

Figure 14C:
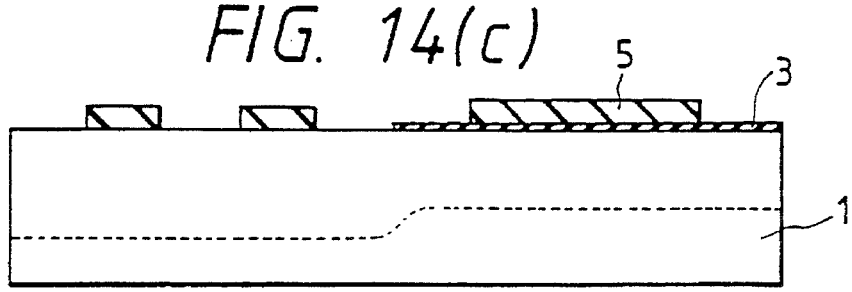
Figure 13A:
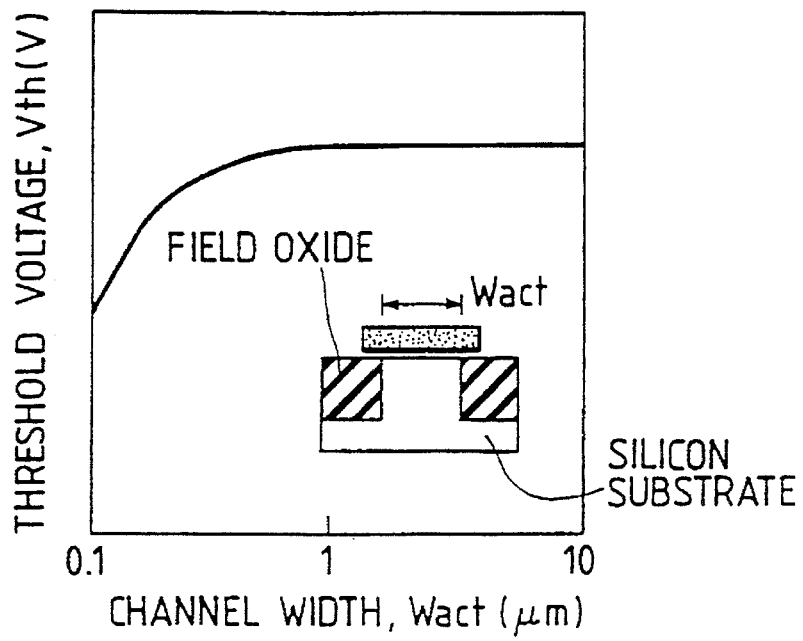
FIGS. 13(a) and 13(b) are views showing the dependence of the device scale on the threshold voltage.
Figure 13B:
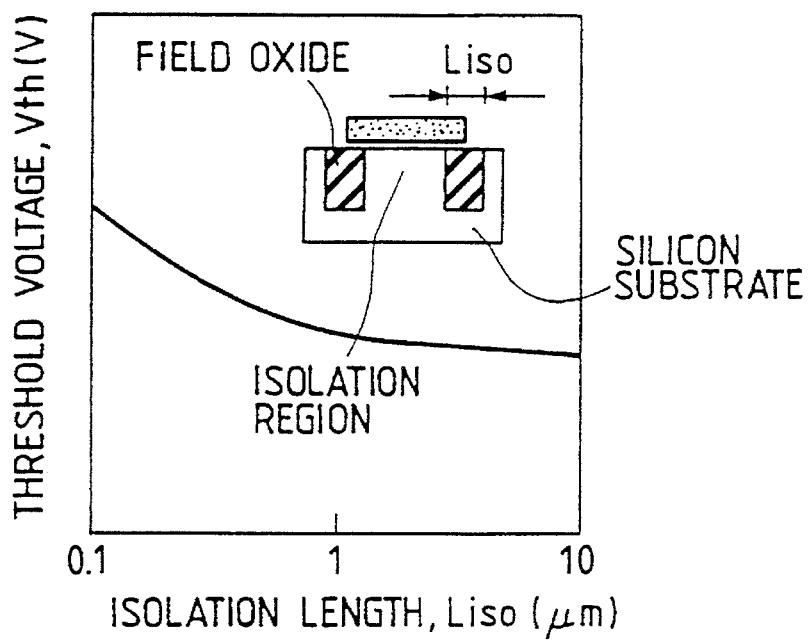

As shown in FIG. 14(c), a silicon nitride film 5 of about 150 nm thick is formed on the whole surface, and the specified portion of the above silicon nitride film 5 in the field isolation area is removed by known lithography and dry etching.

After that, in the same manner as in Example 2, the field oxide is formed in the field isolation area by local oxidation using the silicon nitride film 5 as a mask.

In this example, prior to the formation of the field oxide in the field isolation area, the impurity layer 26 is formed; however, the above processes may be reversed, that is, after the formation of the field oxide, the multi-stage ion implantation may be individually performed in the environmental device area and in the memory cell area, to thus form the field oxide. Also, in this example, the field oxide is formed in the same manner as in Example 2; however, it may be formed in the combined manner of the other examples, which brings the same effect. Accordingly, the explanation of the subsequent processes is omitted.

<Example 10>

Figure 15:
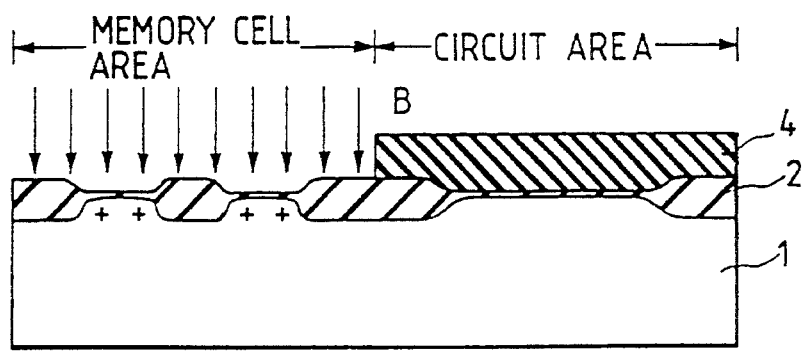
FIG. 15 is a sectional view showing the fabrication process of Example 10 of the present invention.

As shown in FIG. 15, a field oxide 2 for field isolation is formed on a semiconductor substrate 1 having a uniform impurity concentration ($1\times10^{17}/cm^3$) on the surface in the same manner as in Example 2, after which a silicon nitride film in an environmental device area is removed. Next, for setting the threshold voltage of a MOS transistor in the environmental device area, boron ions of about $1\times10^{12}/cm^2$ are firstly implanted on the whole surface of the semiconductor substrate 1. After that, the environmental device area is covered with a photoresist film 4 of about 1 μm thick, and boron ions of about $5\times10^{11}/cm^2$ are secondarily implanted on the memory cell area for compensating the shortage in the first ion implantation of boron. Consequently, the surface concentration of the semiconductor substrate 1 is made higher in the memory cell area as compared with the environmental device area.

The ion implantation processes may be reversed in order. Also, the ion implantation may be separately performed for both the areas in such a manner that an ion implantation mask for covering the memory cell area is separately prepared, and boron ions of about $1\times10^{12}/cm^2$ are implanted in the environmental device area while covering the memory cell area with the photoresist film, after which boron ions of about $1.5\times10^{12}/cm^2$ are implanted in the memory cell area while reversely covering the environmental device area with the photoresist film. The above separative ion implantation processes are reversed in order. Also, the formation of the field oxide 2 may be performed in any manner described in Examples 1 or 3 to 8.

The conditions of ion implantation as shown in Examples 8 and 10 are not limited; and the other conditions may be used according to the applied product and the shape of the field oxide and the like.

<Example 11>

In this example, the thickness of a gate insulating film is changed between an environmental device area and a memory cell area.

Figure 16A:
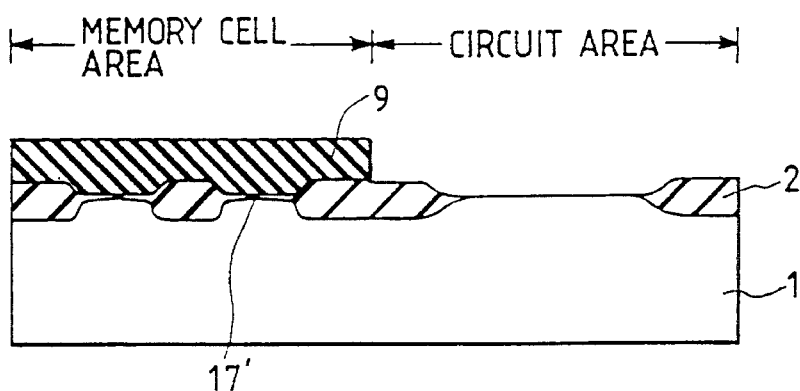
FIGS. 16(a) to 16(c) are sectional views showing the fabrication processes in Example 11 of the present invention.
Figure 16B:
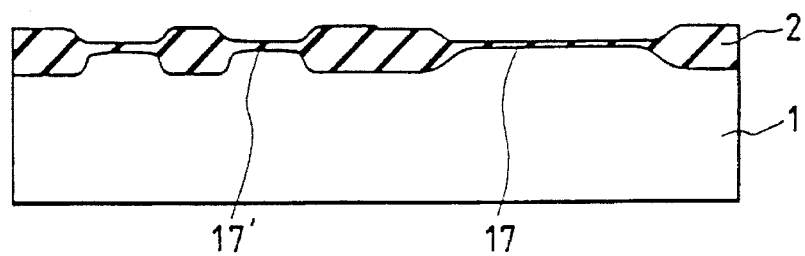

First, as shown in FIG. 16(a), in the same manner as in Example 2, a field oxide 2 for field isolation is formed on the surface of a semiconductor substrate 1, after which a gate oxide film 17' of about 10 nm thick is formed in the memory cell area by thermal oxidation. Subsequently, the memory cell area is covered with a photoresist film 9, after which the exposed portion of gate insulating film 17' formed in the environmental device area is removed using diluted HP solution etc. The photoresist film 9 is removed, and then a gate insulating film 17 is formed in the field isolation area of the environmental device area by thermal oxidation. As a result, since the gate insulating film 17' remains in the memory cell area in the process as shown in FIG. 16(a), the gate insulating film 17' in the memory cell area, as shown in FIG. 16(b), is thicker than the gate insulating film 17 in the environmental device area, and becomes about 14 nm.

Figure 16C:
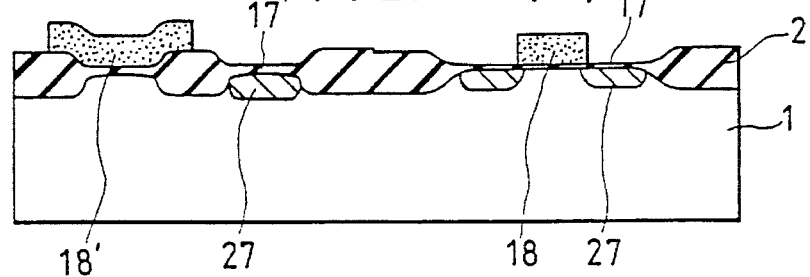

Next, as shown in FIG. 16(c), according to the conventional fabrication method for a MIS field effect transistor, gate electrodes 18 and 18' and diffusion layers 27 and the like are formed. The subsequent processes such as a dielectric film forming process are not directly related to the present invention, and therefore, the explanation thereof is omitted.

In addition, the formation of the field oxide may be performed according to any manner as shown in Examples 1 or 3 to 8. Also, in this example, the gate insulating film is formed by thermal oxidation; however, it may be formed by the other method, for example, chemical vapor deposition. The insulating material other than silicon oxide may be used. Further, the above-described Examples 9 and 10 may be combined with each other. In this case, since the surface concentration of the substrate 1 in the memory cell area is higher, the thickness of the gate insulating film must be about 12 nm in the memory cell area, and for this purpose, the thickness of the first gate insulating film 17' must be about 5 nm.

According to Examples 9 to 11 described above, it is possible to prevent the reduction in the threshold voltage of the MOS transistor in the memory cell area, and hence to avoid the deterioration of the data retention characteristic.

In the above examples, the impurity concentration of the semiconductor substrate 1 is made to be about $1 \times 10^{17}/cm^3$; however, naturally, the concentration becomes different depending on the kind or the fabrication process of the applied semiconductor integrated circuit device. The same is true for the other conditions such as the film thickness and the impurity amount. As the oxidation temperature for forming the field oxide is made higher, the generation of the crystal defects in the memory cell area where the bird beak is not extended is suppressed, and accordingly, the oxidation is preferably performed at a high temperature of about 1100° C.

Further, in the above examples, for simplifying the explanation, the MOS transistor formed on the semiconductor substrate is made to be one conductive type; however, the present invention may be applied for the complementary semiconductor device. In this case, the surface area of the semiconductor substrate may be defined into the first conductor area and the second conductor area.

As described above, according to the present invention, in the environmental device area (peripheral area) having the wide channel width, the lateral extension (bird beak) of the field oxide is made longer, which makes it possible to reduce the strain of the potential profile induced by the difference in the potential profile within the semiconductor substrate, and hence to suppress the generation of the kink. This eliminates the need of enhancing the impurity concentration of the substrate at the device end, which makes it possible to suppress the deterioration of the junction characteristic of the diffusion layer.

Also, the memory cell area being short in the channel width thereby where the lateral extension of the field oxide cannot be enlarged has such a shape as easily generating the kink; however, in the memory cell area, the field isolation area adjacent thereto has a short width, so that the potential profile does not extended up to the deep portion of the above field oxide. Accordingly, similarly to the environmental device area, the strain of the potential profile at the device end is small, which makes the generation of the kink difficult.

Further, in the device being narrow in channel width used in the memory cell area where the threshold voltage is reduced by the inverse narrow channel effect, the surface concentration of the substrate or the thickness of the gate insulating film is increased, which makes it possible to prevent the reduction in the threshold voltage, and hence to prevent the deterioration of the data retention characteristic of the memory device and the increase in stand-by current.

In addition, according to the present invention, the examples of the above memory devices include various kinds of memories such as Dynamic Random Access Memory (DRAM) wherein the memory cell is constituted of one MOS transistor and one capacitor, Static Random Access Memory (SRAM), Electrically Programable Read Only Memory (EPROM), Flash Memory, and Bipolar Memory or the like. Also, as the above environmental device, there can be naturally used various environmental devices for operating the above various memories.

We claim:

1. A semiconductor integrated circuit device comprising:
   a memory cell area including a plurality of memory elements formed on a main surface region of a semiconductor substrate;
   a peripheral area including a plurality of peripheral elements formed on the main surface region of said semiconductor substrate; and
   field isolation insulating films including a first field isolation insulating film for isolating said memory elements from said peripheral elements which are disposed adjacent thereto being formed between said memory cell area and said peripheral area, a second field isolation insulating film for isolating said memory elements from each other being formed on said memory cell area and a third field isolation insulating film for isolating said peripheral elements from each other being formed on said peripheral area,
   wherein an angle between a substantially linear part of a lower surface of each edge portion of said third field isolation insulating film and the main surface of said semiconductor substrate is smaller than an angle between a substantially linear part of the lower surface of each edge portion of said second field isolation insulating film and the main surface of said semiconductor substrate, and
   wherein an impurity concentration on the surface region of said semiconductor substrate interposed between a source region and a drain region of individual MOS transistor elements, which are disposed in said memory cell area, is higher than the impurity concentration on the surface region of said semiconductor substrate interposed between said source region and said drain region of individual MOS transistor elements which are disposed in said peripheral area.

2. A semiconductor integrated circuit device according to claim 1, wherein said angle between the substantially linear part of the lower surface of each edge portion of said third field isolation insulating film and the main surface of said semiconductor substrate is 60° or less.

3. A semiconductor integrated circuit device according to claim 1, wherein a thickness of a gate insulating film for said MOS transistor elements, disposed in said memory cell area, is larger than that of the gate insulating film for said MOS transistor elements formed in said peripheral area.

4. A semiconductor integrated circuit device according to claim 1, wherein said plurality of memory elements and said plurality of peripheral elements are comprised of MOS transistors, respectively.

5. A semiconductor integrated circuit device according to claim 2, wherein a thickness of a gate insulating film for said MOS transistor elements disposed in said memory cell area is larger than that of the gate insulating film for said MOS transistor elements formed in said peripheral area.

6. A semiconductor integrated circuit device according to claim 5, wherein said plurality of memory elements and said plurality of peripheral elements are comprised of MOS transistors, respectively.

7. A semiconductor integrated circuit device according to claim 3, wherein said plurality of memory elements and said plurality of peripheral elements are comprised of MOS transistors, respectively.

* * * * *